(12) United States Patent
Henninger

(10) Patent No.: US 10,159,121 B2
(45) Date of Patent: Dec. 18, 2018

(54) LED LIGHTING DEVICE

(71) Applicant: LUMILEDS HOLDING B.V., Schiphol (NL)

(72) Inventor: Georg Friedrich Alfons Henninger, Aachen (DE)

(73) Assignee: Lumileds Holding B.V., Schiphol (NL)

( * ) Notice: Subject to any disclaimer, the term of this patent is extended or adjusted under 35 U.S.C. 154(b) by 0 days.

(21) Appl. No.: 15/740,165

(22) PCT Filed: Jun. 27, 2016

(86) PCT No.: PCT/EP2016/064849
§ 371 (c)(1),
(2) Date: Dec. 27, 2017

(87) PCT Pub. No.: WO2017/001336
PCT Pub. Date: Jan. 5, 2017

(65) Prior Publication Data
US 2018/0199402 A1    Jul. 12, 2018

(30) Foreign Application Priority Data
Jul. 2, 2015 (EP) .................................... 15174948

(51) Int. Cl.
*H05B 33/08* (2006.01)
*H01L 25/07* (2006.01)
(Continued)

(52) U.S. Cl.
CPC ....... *H05B 33/0806* (2013.01); *F21V 23/023* (2013.01); *F21V 29/70* (2015.01);
(Continued)

(58) Field of Classification Search
CPC ..... F21Y 2115/10; F21Y 2113/13; F21S 4/28; F21S 2/005; F21S 4/20; F21S 8/038;
(Continued)

(56) References Cited

U.S. PATENT DOCUMENTS 8,764,220 B2 * 7/2014 Chan .................. F21V 15/013
                                                  362/217.02
9,247,597 B2 * 1/2016 Miskin ............... H05B 33/0821
(Continued)

FOREIGN PATENT DOCUMENTS

DE    202010013142 U1    2/2011
DE    102013211223 A1    12/2014
(Continued)

OTHER PUBLICATIONS

EPO as ISA, "International Search Report and Written Opinion" dated Oct. 4, 2016 from International Application No. PCT/EP2016/064849, filed Jun. 27, 2016, 12 pages.
(Continued)

*Primary Examiner* — Vibol Tan

(57) ABSTRACT

The invention provides an LED lighting device comprising first and second LED arrangements. Each LED arrangement is positioned on a respective substrate portion so as to form a respective LED module, where each LED arrangement is positioned on its substrate portion so as to be substantially within a single side of a substrate portions surface. The LED modules are arranged such that the first and second LED arrangements are positioned to run alongside one another, such that the positive pole (e.g. the anode) of each LED arrangement is positioned at a same first end and the negative pole (e.g. the cathode) of each LED arrangement is positioned a same second end.

12 Claims, 8 Drawing Sheets

(51) Int. Cl.
*F21V 21/00* (2006.01)
*H01L 27/15* (2006.01)
*F21V 29/70* (2015.01)
*F21V 23/02* (2006.01)
*H01L 33/60* (2010.01)
*H01L 25/075* (2006.01)
*H05K 1/14* (2006.01)
*H05K 1/02* (2006.01)
*F21Y 103/10* (2016.01)
*F21Y 115/10* (2016.01)
*H01L 33/62* (2010.01)

(52) U.S. Cl.
CPC ........ *H01L 25/0753* (2013.01); *H01L 27/156* (2013.01); *H01L 33/60* (2013.01); *H05K 1/142* (2013.01); *F21Y 2103/10* (2016.08); *F21Y 2115/10* (2016.08); *H01L 33/62* (2013.01); *H05K 1/0209* (2013.01); *H05K 2201/09781* (2013.01); *H05K 2201/10106* (2013.01)

(58) Field of Classification Search
CPC . F21K 9/00; F21K 9/278; F21L 4/027; H05K 2201/10106; H05K 1/142; H05B 33/0806; H05B 37/032; H05B 33/0827; H01L 25/0753; H01L 33/62
See application file for complete search history.

(56) References Cited

U.S. PATENT DOCUMENTS

| | | | | |
|---|---|---|---|---|
| 9,516,716 | B2* | 12/2016 | Miskin | H05B 33/0821 |
| 9,518,706 | B2* | 12/2016 | Chan | F21V 15/013 |
| 2006/0139932 | A1 | 6/2006 | Park | |
| 2006/0226522 | A1* | 10/2006 | Liu | G09G 3/006 |
| | | | | 257/680 |
| 2012/0087127 | A1* | 4/2012 | Veerasamy | B32B 17/10036 |
| | | | | 362/249.02 |
| 2014/0361697 | A1* | 12/2014 | Miskin | H05B 33/0821 |
| | | | | 315/192 |
| 2015/0155459 | A1* | 6/2015 | Ishihara | H01L 25/0753 |
| | | | | 362/294 |

FOREIGN PATENT DOCUMENTS

| | | |
|---|---|---|
| EP | 2285195 A1 | 2/2011 |
| WO | 2011139768 A2 | 11/2011 |

OTHER PUBLICATIONS

Extended European Search Report dated Jan. 27, 2016 from European Patent Application No. 15174948.8 filed Jul. 2, 2015, 6 pages.

* cited by examiner

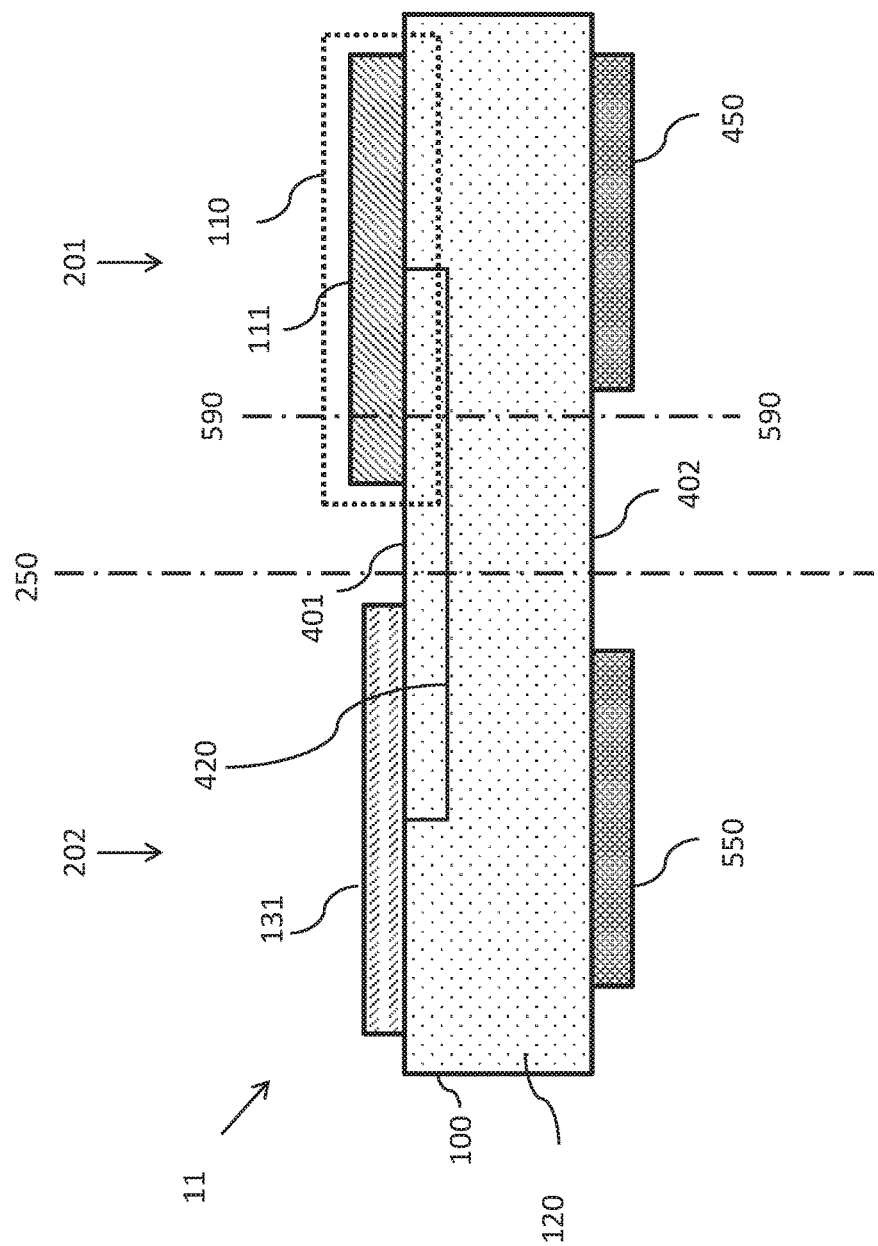

LED LIGHTING DEVICE

CROSS-REFERENCE TO RELATED APPLICATIONS

The present application is a § 371 application of International Application No. PCT/EP2016/064849 filed on Jun. 27, 2016 and titled "AN LED LIGHTING DEVICE," which claims the benefit of European Patent Application No. 15174948.8 filed on Jul. 2, 2015. International Application No. PCT/EP2016/064849 and European Patent Application No. 15174948.8 are incorporated herein.

FIELD OF THE INVENTION

This invention relates to the field of LED lighting devices and more specifically to the field of LED lighting devices comprising a plurality of LED modules.

BACKGROUND OF THE INVENTION

There has been a growing trend toward LED lighting devices, as light emitting diodes (LEDs) are known to have an improved power efficiency and light output over typical halogen light sources.

LED lighting devices may comprise more than one LED module, each module having an arrangement of LEDs positioned toward a single, first side of a respective ceramic circuit board. Positioning an arrangement of LEDs on a single side of a ceramic circuit board in this manner allows for an increased thermal dissipation through use of the other, second side. The second side may, for example be further adapted to allow electrical connection to the LED module, be it by top contacts (e.g. via ribbon bonds) or by bottom contacts (such as in standard SMT technology using, for example, solder).

Furthermore, for many lighting applications it is preferable for lighting devices to have only a single compact area from which light is output. One known method of forming such a single area is to arrange two such LED modules so that the two LED arrangements are positioned alongside one another (i.e. the LED arrangements are made to face one another). It is apparent that the closely positioned LED arrangements form a single area from which light may be output.

To provide electrical connection to the two LED modules, it is known to connect the LED modules serially or in parallel. Serially connected LED modules require a larger voltage for correct operation than LED modules connected in parallel, which may be undesirable. Typically, LED modules connected in parallel disadvantageously comprise a return line positioned between the two LED modules.

SUMMARY OF THE INVENTION

The invention is defined by the claims.

According to a first aspect of the inventive concept there is provided an LED lighting device comprising: a first LED module comprising a first substrate portion having a first LED arrangement positioned substantially to one side of the first substrate portion; and a second LED module comprising a second substrate portion having a second LED arrangement positioned substantially to one side of the second substrate portion, wherein the first LED module and second LED module are arranged such that the first LED arrangement and the second LED arrangements run alongside one another and wherein the anodes of the first and second LED arrangements terminate at a same first end and the cathodes of the first and second LED arrangements terminate at a same second end.

In other words there may be provided a lighting device comprising a first and second LED arrangement, wherein the LED arrangements are positioned side by side so that the modules are oriented 180 degrees relative to each other. The layouts are thus mirror images of each other, in particular the location of the anode and cathode contacts with respect to the overall outer shape. Each LED arrangement is positioned to one side (i.e. off-centre) of a respective substrate portion.

That is to say, an LED arrangement occupies a surface area of a substrate portion where the occupied surface area is substantially in one half of the substrate portion, such that the majority (i.e. more than half) of the LED arrangement (e.g. more than half of the circuitry of the LED arrangement) is positioned, arranged or mounted on no more than half the total surface area of the substrate portion.

There may be considered to be a first side, named a 'mounting side' of the LED module, the mounting side being that side of the substrate portion on which the LED arrangement is substantially positioned. Similarly, there may be considered to be a second side, named a 'non-mounting side' of the LED module, the non-mounting side being that side of the substrate portion which the LED arrangement is not substantially positioned.

Positioning the first LED arrangement and the second LED arrangement alongside one another might be understood to mean that the length of the first LED arrangement runs along substantially parallel to the length of the second LED arrangement Thus, the first LED module is arranged such that the entirety of the mounting side of the first LED module is more proximate to the mounting side of the second LED module than any other aspect of the LED module. In other words, the LED modules are arranged such that the LED arrangements are positioned back-to-back.

When oriented in this manner, in the polarity of each LED arrangement is orientated to be in the same direction. In other words, the anodes of each LED arrangement terminate at a same first end and the cathodes of each LED arrangement terminate at a same second end. That is to say, the positive poles of each LED arrangement are at a same first end and the negative poles of each LED arrangement are also at a same second end.

Conceptually, when each LED module is oriented in the same direction relative to its respective LED arrangement, the polarity of each LED arrangement is opposite to the other. By way of example, if the first LED module and the second LED module are conceptually arranged or orientated such that the LED arrangement of each LED module is positioned at the top of its respective module (i.e. the mounting side of the substrate portion is positioned is the topmost part of the LED module), the electrical polarity of each LED arrangement is opposite to the other LED arrangement.

Thus if a mounting side of each LED module were to be positioned side-by-side, with the remainder of the LED module lying in the same relative direction to its respective mounting side, the same poles of the first and second LED module would be proximate to one another (e.g. the positive poles of the first and second LED modules would be immediately side-by-side).

It may be otherwise understood that when a cross-section of each LED module is taken, in a normal plane including the end-to-end length direction, the polarity of the first LED arrangement is opposite to the polarity of the second LED arrangement (e.g., the leftmost side/pole of the first LED arrangement is positive and the leftmost side/pole of the second LED arrangement is negative or vice versa).

A lighting device according to an embodiment may allow for a smaller overall area of a lighting device, as well as a more compact area from which light is output, when compared to a conventional LED lighting device. A lighting device as herein described also allows for reduced wiring and/or circuit connections as well as a reduced overall wiring complexity of the lighting device.

Preferably the LED arrangement is positioned to run alongside an edge of the substrate portion. The substrate portion may, for example, be a surface of a board on which the LED arrangement is mounted. Each LED arrangement may be associated with a separate board, such that the total surface area of a surface of each board is considered to be the substrate portion.

The first LED arrangement and the second LED arrangement are preferably positioned to be electrically in parallel. Preferably, the first and second LED modules are electrically connected in parallel.

In other words if each LED module is considered to have a respective positive end (e.g. an anode) and a respective negative end (e.g. a cathode) the positive ends of the LED module are positioned next to one another and the negative ends are positioned next to one another. Preferably, the positive ends are connected together and the negative ends are connected together.

The first LED arrangement may comprise a first plurality of serially connected LEDs, and the second LED arrangement may correspondingly comprise a second plurality of serially connected LEDs.

In other words, the LEDs of each LED arrangement are preferably electrically arranged in series. It will be readily understood that in alternative embodiments, the LEDs of each LED arrangement are electrically arranged in parallel.

The first LED module may be considered to comprise a first anode and a first cathode connected to the first LED arrangement; and the second LED modules may be considered to comprise a second anode and a second cathode connected to the second LED arrangement.

Due to the arrangement of the LED modules, the first anode is typically more proximate to the second anode than the second cathode, and the first cathode is typically more proximate to the second cathode than the first anode.

The lighting device may further comprise: a first electrical pad electrically connected to anodes of the first and second LED arrangements (i.e. the first and second anode); and a second electrical pad electrically connected to the cathodes of the first and second LED arrangements (i.e. the first and second cathode).

Each substrate portion is a preferably a separate ceramic board such that the first LED arrangement is mounted on a single side of a first surface of a first ceramic board; and the second LED arrangement is mounted on a single side of a first surface of a second ceramic board.

In other words, each LED arrangement may be associated with a ceramic board and each LED arrangement may be mounted along one side of a respective ceramic board. That is to say, the surface area of a ceramic board which an LED arrangement occupies may be substantially in one half of the ceramic board, such that the majority (i.e. more than half) of the LED arrangement is positioned in half the ceramic board. In preferable embodiments, each LED arrangement is positioned wholly within one half of the available or selected surface area of a ceramic board, such that at least half of the said surface area does not comprise any portion of the LED arrangement.

In some further embodiments, at least one of the anode and cathode of the first LED arrangement is positioned on a second, different side of the first surface of the first ceramic board; and at least one of the anode and cathode of the second LED arrangement is positioned on a second, different side of the first surface of the second ceramic board.

In other or further embodiments at least one of the anode and cathode of the first LED arrangement is positioned on a second surface of the first ceramic board, said second surface being opposite to the first surface of the first ceramic board; at least one of the anode and cathode of the second LED arrangement is positioned on a second surface of the second ceramic board, said second surface being opposite to the first surface of the second ceramic board.

Each LED module may further comprise circuitry through the ceramic board to electrically connect its respective cathode and anode to its LED arrangement.

In other or further embodiments, the first LED module further comprises a first thermal pad positioned on a second surface of the first ceramic board, said second surface being opposite to the first surface of the first ceramic board; and the second LED module further comprises a second thermal pad positioned on a second surface of the first ceramic board, said second surface being opposite to the first surface of the first ceramic board.

The lighting device may further comprise a lead frame, wherein the first and second LED modules bridge an aperture in the lead frame.

The first and second LED module may be, for example, mounted upon or embedded within a printed circuit board, lead frame or other chip carrier.

According to a second aspect of the inventive concept there is provided a method of forming a lighting device, the method comprising: providing a first LED module comprising a first substrate portion having a first LED arrangement positioned substantially towards one side of the first substrate portion; providing a second LED module comprising a second substrate portion having a second LED arrangement positioned substantially towards one side of the second substrate portion, wherein the anode/cathode layout of the second LED arrangement is a mirror of the anode/cathode layout of the first LED arrangement; and positioning the second LED module alongside the first LED module such that the first LED arrangement and the second LED arrangement are positioned alongside one another.

Optionally the first LED arrangement comprises a first plurality of serially connected LEDs and the second LED arrangement comprises a second plurality of serially connected LEDs.

Optionally, the method comprises electrically connecting a first electrical pad to the anodes of the first and second LED arrangements; and electrically connecting a second electrical pad to cathodes of the first and second LED arrangements.

The method may further comprise: mounting the first LED arrangement on one side of a first surface of a first ceramic board such that the first LED module comprises a first ceramic board; and mounting the second LED arrangement on one side of a first surface of a second ceramic board such that the second LED module comprises a second ceramic board.

In embodiments the method comprises: positioning at least one first thermal pad on a second surface of the first ceramic board, said second surface being opposite to the first surface of the first ceramic board; and positioning at least one second thermal pad on a second surface of the second ceramic board, said second surface being opposite to the first surface of the second ceramic board.

Optionally, the method comprises: bridging an aperture of a lead frame with the first LED module; and bridging the same aperture of the lead frame with the second LED module.

These and other aspects of the invention will be apparent from and elucidated with reference to the embodiment(s) described hereinafter.

BRIEF DESCRIPTION OF THE DRAWINGS

Examples of the invention will now be described in detail with reference to the accompanying drawings, in which:

FIG. 5A depicts a first cross-sectional view of a first LED module according to a second embodiment of the invention;

DETAILED DESCRIPTION OF THE EMBODIMENTS

Figure 1:
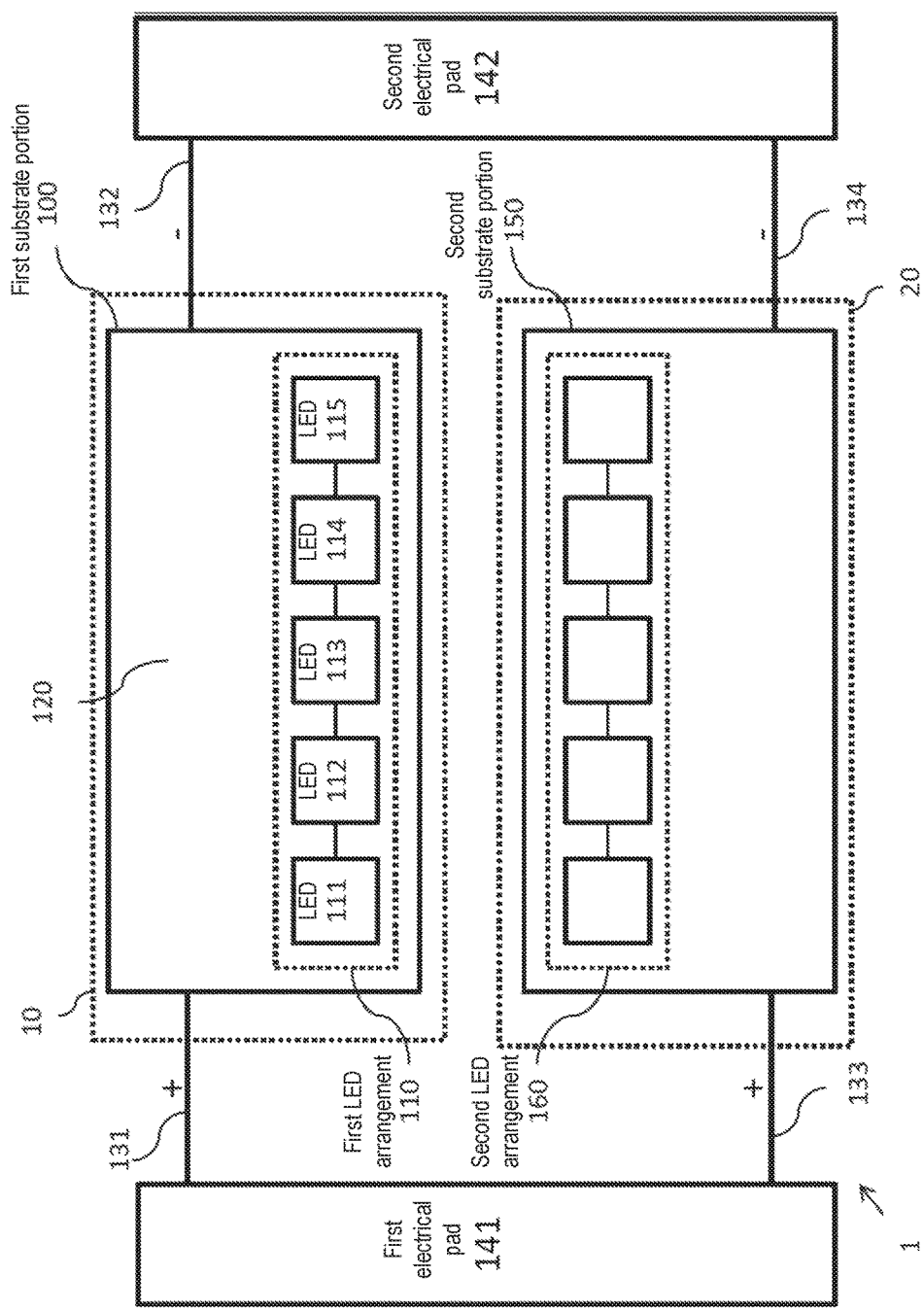
FIG. 1 schematically illustrates a lighting device according to a first embodiment of the invention.

The invention provides an LED lighting device comprising first and second LED arrangements. Each LED arrangement is positioned on a respective substrate portion so as to form a respective LED module, where each LED arrangement is positioned on its substrate portion so as to be substantially within a single side of a substrate portion surface. The LED modules are arranged such that the first and second LED arrangements are positioned to run alongside one another, such that the positive pole (e.g. the anode) of each LED arrangement is positioned at a first end and the negative pole (e.g. the cathode) of each LED arrangement is positioned a same second end.

A lighting device 1 according to an embodiment may be readily described with reference to FIGS. 1-5. The lighting device 1 comprises a first LED module 10 having a first substrate portion 100 and a second LED module 20 having a second substrate portion 150. The first LED module comprises a first LED arrangement 110 mounted on the first substrate portion 100 and the second LED module 150 comprises a second LED arrangement 160 mounted on the second substrate portion 150.

In the present embodiment, each substrate portion 100, 150 is a separate ceramic board comprising ceramic material, upon which an LED arrangement is mountable. In other embodiments, a substrate portion is, for example, a respective portion of a wafer of semiconducting material. Typically each LED module is considered to be separated from the other LED module such that there is a gap (e.g. an air gap) between the first LED arrangement and the second LED arrangement.

Exemplary ceramic materials may comprise, by way of example only, at least one of: AlN, $Al_2O_3$, SiC and WC.

Figure 2:
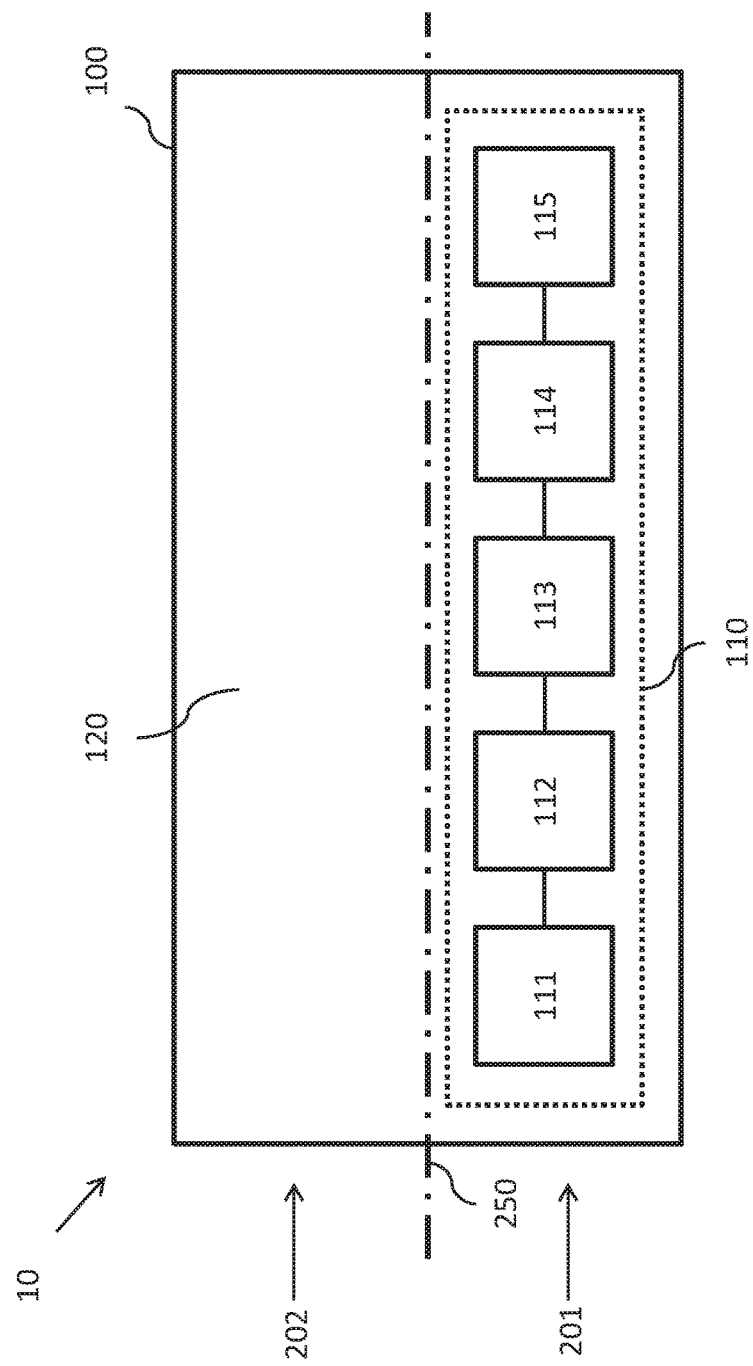
FIG. 2 illustrates a first LED module according to the first embodiment of the invention.

The arrangement of a typical LED module is described with reference to FIG. 2, which illustrates the first LED module 10. There may be considered to be two sides or halves to a substrate portion 100. Hence a substrate portion 100 may be thought to be split 250 (e.g. in half) into a first 201 and second 202 side, respectively named a mounting side 201 and a non-mounting side 202. The LED arrangement 110 is positioned to be substantially within the mounting side 201. Typically, nothing or only passive SMD components as e.g. a TVS diode is mounted on the non-mounting side; thereby allowing the non-mounting side to act as a heat spreader 120, permitting for thermal dissipation.

In some embodiments, however, the LED arrangement 110 may partially encroach or be partially mounted on the non-mounting side. It should be understood, however, that the majority (i.e. more than half) of the LED arrangement 110 is positioned on no more than half of the substrate portion (i.e. more than half the LED arrangement is positioned on a mounting side).

Turning back to FIG. 1, each LED arrangement has a respective pair of electrical poles (as identified with the + and − characters), conferring a respective polarity. As presently embodied, each LED arrangement is associated with a pair of external connectors, wherein the external connectors are adapted to be held at opposing voltages. For example, a first LED arrangement is associated with and connected to a first anode 131 and a first cathode 132, and the second LED arrangement is associated with and connected to a second anode 133 and a second cathode 134.

Figure 3:
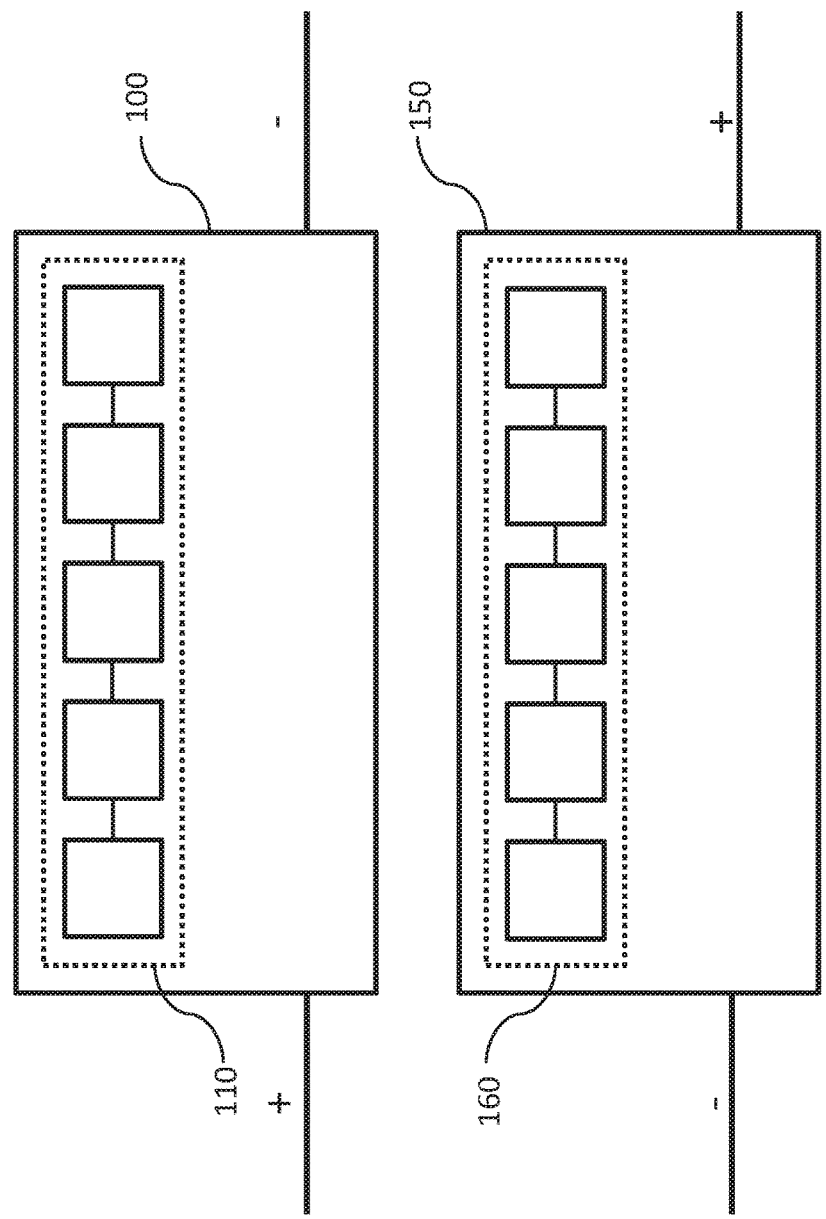
FIG. 3 illustrates a conceptual view of a first and second LED module according to the first embodiment of the invention.

The polarity of the first LED arrangement 110 is opposite to the polarity of the second LED arrangement 160 when the LED modules are viewed orientated in the same direction with respect to their LED arrangements. For example, as shown in FIG. 3, when each LED module 100, 150 is orientated such that its respective LED arrangement 110, 160 is positioned to be the uppermost portion of the LED module, the polarity of the first LED arrangement 110 is opposite to the polarity of the second LED arrangement 160.

Accordingly, as herein embodied, when orientated in this manner, the first anode is positioned on the opposite side of its LED module relative to the position of the second anode on its LED module. It may therefore be understood that the relative polarity of the first LED arrangement in the first LED module is the inverse of the relative polarity of the second LED arrangement in the second LED module.

In at least one embodiment, in order to achieve this opposite polarity of the LED arrangements 110, 160, the circuit layout of the second LED arrangement is a mirror image of the circuit layout of the first LED arrangement. In other words, a mask design or other schematic view of the circuit layout of the first LED arrangement is a flipped or mirrored image of the mask design or schematic view of the circuit layout of the second LED arrangement. However, embodiments are not necessarily limited thereto.

The first LED module 100 is arranged with respect to the second LED module 150 such that the first LED arrangement 110 is made to run alongside the second LED arrangement 160. In other words, in a top-down or plan view (such as in FIG. 1), the two LED arrangements are positioned to face each other such that, for example, first and second anode are positioned together at a same first end and the first and second cathode are also positioned together at a same second end.

The positioning of the first and second LED arrangements in this manner allows there to be a single, compact area from which light is output. This may, for example, allow the LED arrangements to simulate an elongated light source (e.g. replicate a filament of a halogen light source).

The first and second anode may be connected by a first electrical pad 141 and the first and second cathode may be connected by a second electrical pad, thereby connecting the first and second LED modules in parallel. This allows for same voltage may be supplied to each LED arrangement to ensure, for example, a consistent light output from the two LED arrangements. Furthermore, provision of a single electrical pad for each set of anodes/cathodes reduces the overall wiring complexity of the lighting device.

By way of example, to power an LED arrangement, a voltage difference of no more than 12V may be required across the said LED arrangement. In some embodiments, therefore, a voltage of 12V is supplied to each of the first and second anodes or, preferably, to a first electrical pad connecting the first and second anodes. Similarly, in other of further embodiments, a ground voltage may be applied to the first and second cathodes or, preferably, supplied to a second electrical pad connecting the first and second cathodes.

A skilled person would readily understand that an LED refers to a light emitting diode, and may comprise any semiconductor light source known in the art that comprises at least two electrical connectors (e.g. an anode or cathode). An LED arrangement comprises at least one such LED and optionally additional circuitry adapted to allow the at least one LED to emit light when the LED arrangement is powered (e.g. a resistor).

In embodiments, an LED arrangement comprises a plurality of electrically connected LEDs. For example, the first LED arrangement 110 comprises a first 111, second 112, third, 113, fourth 114 and fifth 115 LED. These LEDs may be connected either in parallel or preferably in series, as herein embodied. In such embodiments (when the LEDs are connected in series) the anode of the first LED 111 may form the anode of the LED arrangement, and the cathode of the last LED in the series of LEDs (e.g. fifth LED 115) may form the cathode of the LED arrangement. The anode and cathode of the LED arrangement may be connected to a respective external connector, for example, the anode and cathode of the first LED arrangement is connected to the first anode 131 and the first cathode 132. Preferably, the first and second LED arrangements comprise the same number of LEDs.

Figure 4A:
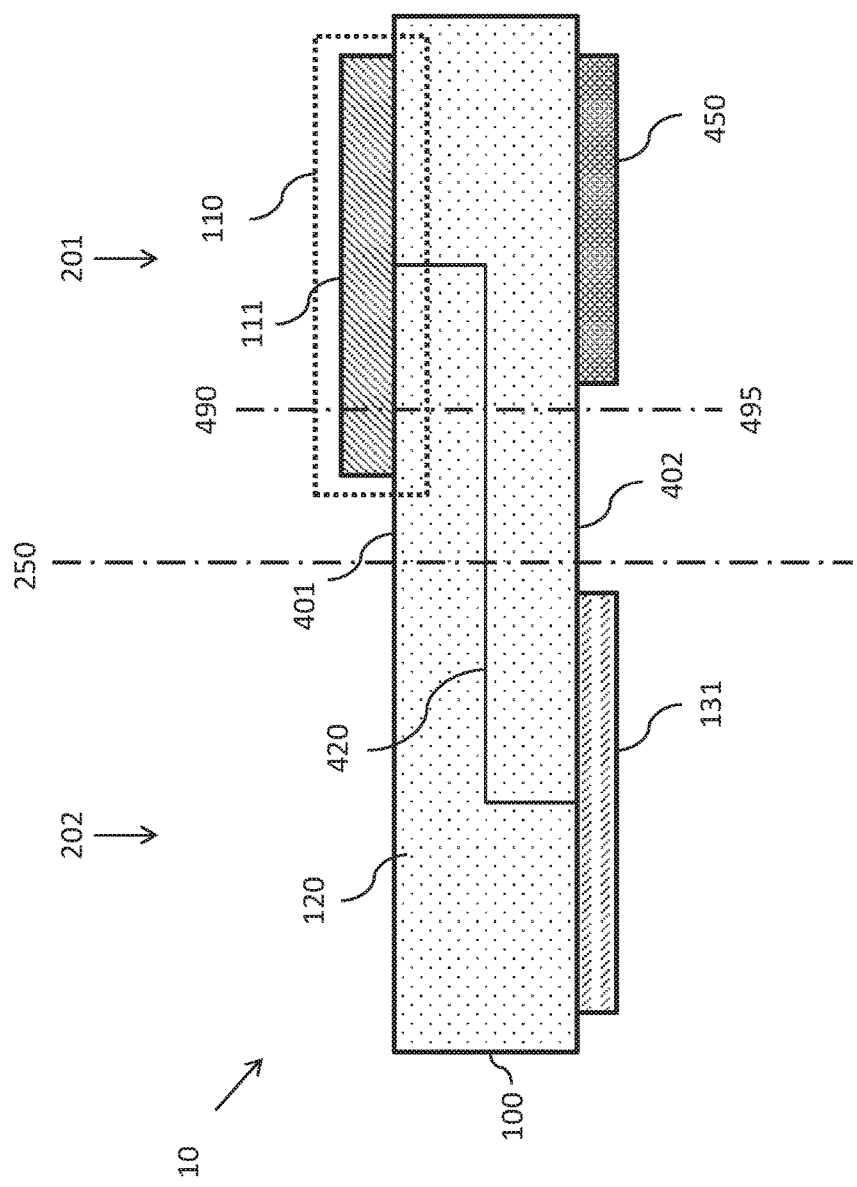
FIG. 4A depicts a first cross-sectional view of the first LED module according to the first embodiment of the invention.
Figure 4B:
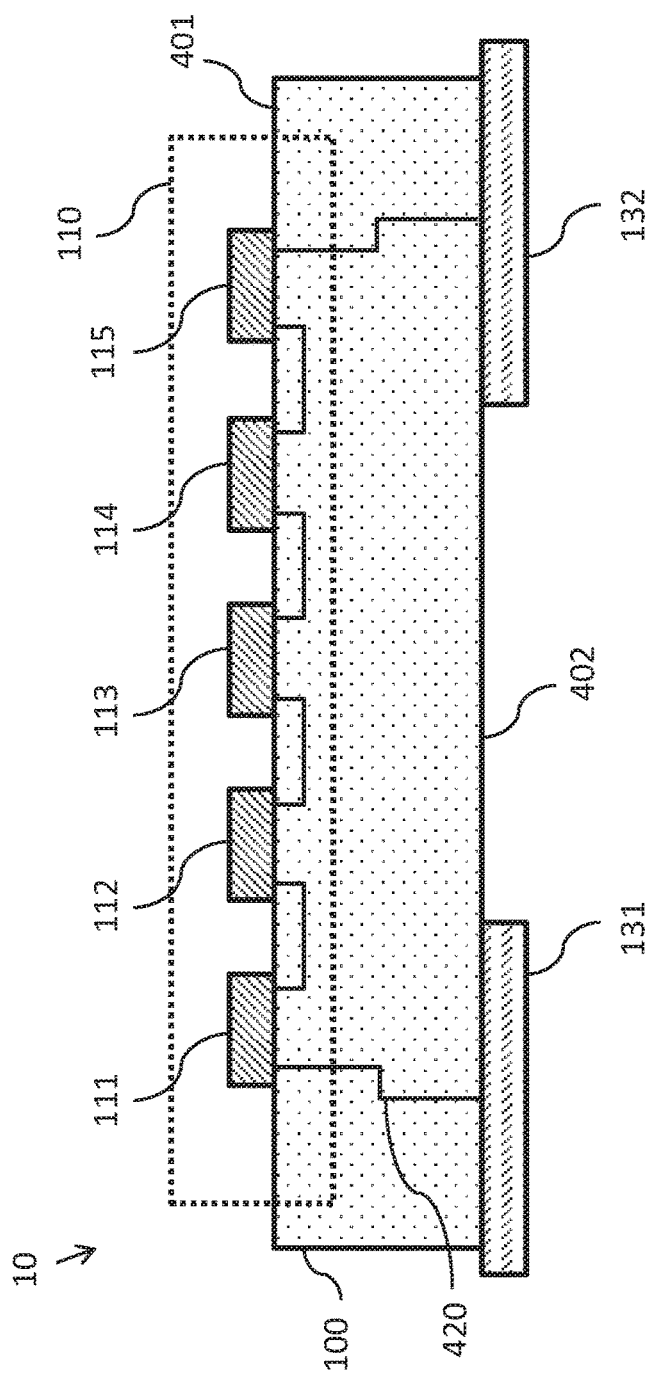
FIG. 4B depicts a second cross-sectional view of the first LED module according to the first embodiment of the invention.

Referring now to FIGS. 4A and 4B, two cross-sections of the first LED module 10 are shown. A first cross section, FIG. 4A, identifies the first LED module in a plane including the side-to-side width direction, such that only the first LED 111 of the LED arrangement 110 is visible. A second cross-section, FIG. 4B, illustrates the first LED module in a plane including the end-to-end length direction (i.e. viewed towards the axis 490-495 identified in FIG. 4A).

The first LED arrangement may be thought to be mounted on a mounting side 201 of a first surface 401 (e.g. an upper surface) of the substrate portion.

Positioned on a second surface 402 of the substrate portion, the second surface being a surface of the substrate portion opposite to and facing the first surface 401 (e.g. a lower surface), is the first anode 131 and the first cathode 132. Preferably the first anode and first cathode are positioned to not be directly opposite the LED arrangement but may rather, for example, be positioned at the non-mounting side 202 of the second surface of substrate portion 100.

The first anode 131 and first cathode 132 may be electrically connected to the LED arrangement 110 by a respective through-wire, a respective via, or other known connecting circuitry. For example, the first anode 131 is connected to the first LED 111 of the LED arrangement by through-wire 420 which passes through the material of the first ceramic board/substrate portion 100.

In embodiments, an LED module may further comprise a thermal pad 450 positioned on the second surface 402 of the substrate portion (e.g. a lower surface). The thermal pad is adapted to contribute to the conduction of heat away from the substrate portion 100 by, for example, thermally coupling the substrate portion to an external heat sink (e.g. a substrate of a PCB). Preferably the thermal pad 450 is positioned on the second surface directly opposite to the LED arrangement 110. Thus, for example, the thermal pad is positioned on the mounting side of the second surface of the substrate portion.

It will be readily apparent to the skilled person that either one of the first and second LED modules may comprise at least one (and preferably all) of the above described features. However any combination of the features herein identified may be present in any such LED modules without departing from the scope of the invention.

The lighting module 10 may further comprise a mount to which the first LED module 10 and the second LED module 20 are mounted. By way of example, the first LED module may be mounted upon a printed circuit board, lead frame or other chip carrier, or may be embedded therein. The first electrical pad 141 and the second electrical pad 142 may be formed as an aspect of the mount, such that the mount may comprise at least two conductive areas for connection to the first and second LED modules.

In some exemplary embodiments, each LED module is positioned to bridge a single aperture in a lead frame. The portions of lead frame either side of the said aperture may in embodiments form the first 141 and second electrical pads 142.

In some embodiments, each substrate portion of the lighting module is a portion of a printed circuit board such that each LED module is formed on a single printed circuit board. In other or further embodiments, each LED module is a separate die, chip or integrated circuit.

The lighting module 10 may comprise additional LED modules, for example, mounted on the mount. This would allow for a plurality of compact areas of light source to be provided.

Figure 5B:
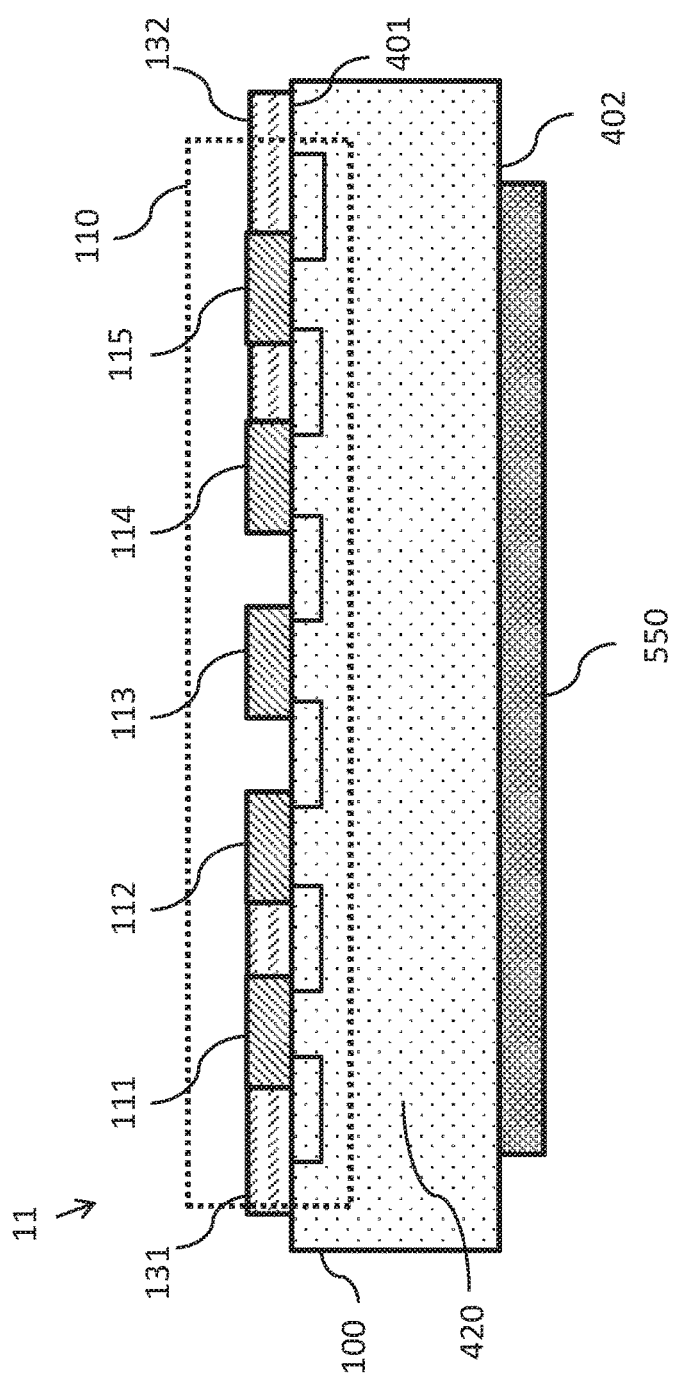
FIG. 5B depicts a second cross-sectional view of the first LED module according to the second embodiment of the invention.

Referring now to FIGS. 5A and 5B, two cross-sections of a first LED module 11 for a lighting device according to a second embodiment of the invention are shown. The lighting device according to the second embodiment of the invention comprises the same features of the lighting device according to the first embodiment described with reference to FIG. 1-4B in an alternative configuration. Only those features that are differently embodied are hereafter described.

A first cross section, FIG. 5A, identifies a first LED module 11 in a plane including the side-to-side width direction, such that only the first LED 111 of the LED arrangement 110 is visible. A second cross-section, FIG. 5B, illustrates the first LED module in a plane including the end-to-end length direction (i.e. viewed towards the axis 590-595 identified in FIG. 5A).

Rather than the anode 131 and cathode 132 of the LED arrangement 110 being positioned on a second surface of the substrate portion 402, the anode 131 and cathode 132 are positioned on the same first surface of the substrate portion 402. In the present embodiment, the anode and cathode of the LED arrangement are both positioned on the second, non-mounting side 202 of the substrate portion 402. Such an arrangement may advantageously allow, for example, an additional thermal pad 550 to be positioned on the second, lower surface 402. Such a thermal pad 550 may, for example, be positioned on the non-mounting side 202 of the second surface 402 and span along the length of the LED module 11. This may allow for an increased conduction of heat away from the substrate portion 100.

Thus an LED module for a lighting device according to a second embodiment of the invention may be considered to be a top contact LED module, whereas the LED module for a lighting device according to the first embodiment of the invention may be considered to be a bottom contact LED module.

It will be readily understood that any combination of positioning of the anode and cathode on a substrate may be realised without departing from the scope of the invention. For example, the anode 131 of the LED arrangement 110 may be positioned on a first surface of the substrate portion, and the cathode 131 of the LED arrangement 110 may be positioned on a second, opposite, surface of the LED portion (i.e. the anode is top-mounted and the cathode is bottom-mounted).

It should also be understood that the anode and cathode need not be positioned on the non-mounting side of the LED module, but may rather also be mounted on the mounting side of the LED module. The positions of the anode and cathode for the first and second LED modules of a lighting device need not be identical, although this may advantageously simplify the production process.

Although herein embodied as having a rectangular or oblong shape/surface area, a substrate portion should not be construed as limited to such a shape, but may rather by and shape regular or irregular.

Figure 6:
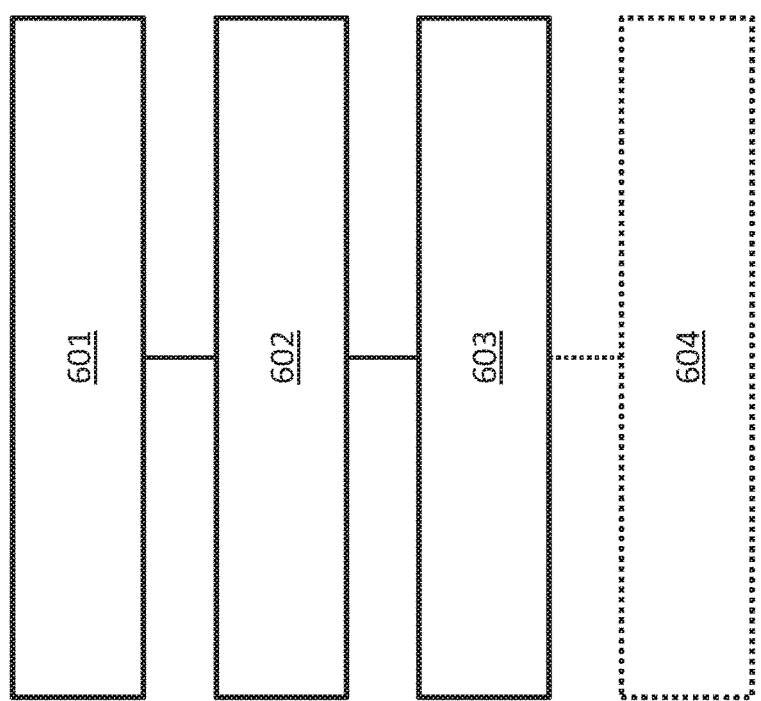
FIG. 6 conceptually illustrates a flowchart of a method of providing a lighting device according to an embodiment of the invention.

According to another embodiment of the invention, there may be a method of providing an LED lighting device, for example the LED lighting device 1. Such a method may be described with reference to FIG. 6.

The method may comprise: providing 601 a first LED module comprising a first substrate portion having a first LED arrangement positioned substantially towards one side of the first substrate portion; providing 602 a second LED module comprising a second substrate portion having a second LED arrangement positioned substantially towards one side of the second substrate portion, wherein the anode/cathode layout of the second LED arrangement is a mirror of the anode/cathode layout of the first LED arrangement; and positioning 603 the second LED module alongside the first LED module such that the first LED arrangement and the second LED arrangement are positioned alongside one another.

Optionally, the method may further comprising mounting the first LED module and the second LED module to a mount, for example, a printed circuit board, lead frame or other chip carrier.

Optionally, the method may comprise electrically connecting 604 a first electrical pad to the anodes of the first and second LED arrangements; and electrically connecting a second electrical pad to cathodes of the first and second LED arrangements.

Optionally, the method may comprise mounting the first LED arrangement on one side of a first surface of a first ceramic board such that the first LED module comprises a first ceramic board; and mounting the second LED arrangement on one side of a first surface of a second ceramic board such that the second LED module comprises a second ceramic board.

In further embodiments, the method comprises positioning at least one first thermal pad on a second surface of the first ceramic board, said second surface being opposite to the first surface of the first ceramic board; and positioning at least one second thermal pad on a second surface of the second ceramic board, said second surface being opposite to the first surface of the second ceramic board.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An LED lighting device, comprising:
   a first LED module comprising a first substrate portion, a first LED arrangement positioned at a surface area substantially in one half of the first substrate portion, and a first thermal pad; and
   a second LED module comprising a second substrate portion, a second LED arrangement positioned at a surface area substantially in one half of the second substrate portion, and a second thermal pad,
   wherein the first and second LED modules are arranged such that the first and the second LED arrangements run alongside one another,
   wherein a polarity of the first LED arrangement and a polarity of the second LED arrangement are opposite when the first and the second substrate portions are oriented such that the first and the second LED arrangements are at a topmost part of the first and the second substrate portions, respectively;
   wherein anodes of the first and the second LED arrangements terminate at a same first end and cathodes of the first and the second LED arrangements terminate at a same second end;
   wherein the first and the second LED arrangements are electrically connected in parallel;
   wherein the first LED arrangement is mounted on a first surface of the first substrate portion and the first thermal pad is positioned on a second surface of the first substrate portion, the second surface of the first substrate portion being opposite to the first surface of the first substrate portion; and
   wherein the second LED arrangement is mounted on a first surface of the second substrate portion and the second thermal pad is positioned on a second surface of the second substrate portion, the second surface of the second substrate portion being opposite to the first surface of the second substrate portion.

2. The lighting device of claim 1, wherein the first LED arrangement comprises a first plurality of serially connected LEDs, and the second LED arrangement comprises a second plurality of serially connected LEDs.

3. The lighting device of claim 1, further comprising:
   a first electrical pad electrically connected to the anodes of the first and the second LED arrangements; and
   a second electrical pad electrically connected to the cathodes of the first and the second LED arrangements.

4. The lighting device of claim 1, wherein each substrate portion is a separate ceramic board and:
   the first LED arrangement is mounted on a first side of the first surface of a first ceramic board; and
   the second LED arrangement is mounted on a first side of the first surface of a second ceramic board.

5. The lighting device of claim 4, wherein:
   at least one of the anode and the cathode of the first LED arrangement is positioned on a second, different side of the first surface of the first ceramic board; and
   at least one of the anode and the cathode of the second LED arrangement is positioned on a second, different side of the first surface of the second ceramic board.

6. The lighting device of any of claim 4, wherein:
   at least one of the anode and the cathode of the first LED arrangement is positioned on the second surface of the first ceramic board, the second surface being opposite to the first surface of the first ceramic board;
   at least one of the anode and cathode of the second LED arrangement is positioned on the second surface of the second ceramic board, the second surface being opposite to the first surface of the second ceramic board.

7. The lighting device of claim 1, further comprising a lead frame, wherein the first and second LED modules bridge an aperture in the lead frame.

8. The lighting device of claim 1, wherein the first and the second LED modules are mounted upon or embedded within a printed circuit board, lead frame or other chip carrier.

9. A method of forming a lighting device, comprising:
   providing a first LED module comprising a first substrate portion, a first LED arrangement mounted on a first surface of the first substrate portion, and at least one first thermal pad on a second surface of the first substrate portion, the second surface of the first substrate portion being opposite to the first surface of the first substrate portion, the first LED arrangement being positioned at a surface area substantially towards one half of the first substrate portion;
   providing a second LED module comprising a second substrate portion, a second LED arrangement mounted on a first surface of the second substrate portion, and at least one second thermal pad on a second surface of the second substrate portion, the second surface of the second substrate portion being opposite to the first surface of the second substrate portion, the second LED arrangement being positioned at a surface area substantially towards one half of the second substrate portion;
   positioning the second LED module alongside the first LED module such that the first and the second LED arrangements are positioned alongside one another,
   wherein an anode/cathode layout of the second LED arrangement is a mirror of an anode/cathode layout of the first LED arrangement;
   wherein a polarity of the first LED arrangement and a polarity of the second LED arrangement are opposite when the first and the second substrate portions are oriented such that the first and the second LED arrangements are at a topmost part of the first and the second substrate portions, respectively; and
   wherein the first and the second LED arrangements are electrically connected in parallel.

10. The method of claim 9, further comprising:
electrically connecting a first electrical pad to anodes of the first and the second LED arrangements; and
electrically connecting a second electrical pad to cathodes of the first and the second LED arrangements.

11. The method of claim 9, wherein:
each substrate portion is a separate ceramic board;
the method further comprises:
   mounting the first LED arrangement on one side of the first surface of a first ceramic board; and
   mounting the second LED arrangement on one side of the first surface of a second ceramic board.

12. The method of claim 9, further comprising:
bridging an aperture of a lead frame with the first LED module; and
bridging the same aperture of the lead frame with the second LED module.

* * * * *